(12) United States Patent
Belotserkovsky

(10) Patent No.: US 6,678,012 B1
(45) Date of Patent: Jan. 13, 2004

(54) LNB DRIFT SEARCH SYSTEM FOR DBS PRODUCTS

(75) Inventor: Maxim Borisovich Belotserkovsky, Indianapolis, IN (US)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/673,041

(22) PCT Filed: Apr. 16, 1999

(86) PCT No.: PCT/US99/08367

§ 371 (c)(1),
(2), (4) Date: Oct. 10, 2000

(87) PCT Pub. No.: WO99/54998

PCT Pub. Date: Oct. 28, 1999

Related U.S. Application Data

(60) Provisional application No. 60/082,115, filed on Apr. 17, 1998.

(51) Int. Cl.[7] .................................................. H04N 5/50
(52) U.S. Cl. ........................ 348/731; 348/732; 375/324; 375/327; 331/1 A
(58) Field of Search ................................. 348/731, 725, 348/726; 375/332, 354, 326, 316, 344, 376, 339; 331/16, 18, 25, 1 A

(56) References Cited

U.S. PATENT DOCUMENTS

| | | | | |
|---|---|---|---|---|
| 4,081,752 A | | 3/1978 | Sumi | 325/335 |
| 4,272,729 A | | 6/1981 | Riley, Jr. | 331/1 A |
| 5,430,890 A | * | 7/1995 | Vogt et al. | 455/180.3 |
| 5,739,874 A | | 4/1998 | Badger et al. | 348/731 |
| 5,946,292 A | * | 8/1999 | Tsujishita et al. | 370/204 |
| 5,987,074 A | * | 11/1999 | Wakamatsu | 375/332 |
| 6,310,924 B1 | * | 10/2001 | Kang et al. | 375/326 |
| 6,363,126 B1 | * | 3/2002 | Furukawa et al. | 375/344 |
| 6,389,082 B1 | * | 5/2002 | Takigawa et al. | 375/316 |

FOREIGN PATENT DOCUMENTS

EP  0782271  7/1997 ........... H03L/7/107

* cited by examiner

*Primary Examiner*—Michael H. Lee
(74) *Attorney, Agent, or Firm*—Joseph S. Tripoli; Kuniyuki Akiyama

(57) ABSTRACT

The present invention concerns a digital signal tuning apparatus which includes an offset frequency correction system. In the offset frequency correction system, searching for an offset signal starts from an end point of a band of frequencies in which the offset signal may be found.

3 Claims, 5 Drawing Sheets

LNB DRIFT SEARCH SYSTEM FOR DBS PRODUCTS

This application claims the benefit of provisional application Ser. No. 60/082,115 filed Apr. 17, 1998.

The present invention concerns a tuning system for a satellite receiver, especially one capable of receiving and processing television signals transmitted in digital form.

BACKGROUND INFORMATION

Satellite television receiving systems usually comprise an "outdoor unit" including a dish-like receiving antenna and a "block" converter, and an "indoor unit" including a tuner and a signal processing section. The block converter converts the entire range ("block") of relatively high frequency RF signals transmitted by a satellite to a more manageable, lower range of frequencies.

In a conventional satellite television transmission system, television information is transmitted in analog form and the RF signals transmitted by the satellite are in the C (e.g., 3.7 to 4.2 GHz) and Ku (e.g., 11.7 to 14.2 GHz) bands. The RF signal received from the satellite by the antenna of the receiving system are converted by the block converter to the L band (e.g., 900 to 2000 MHz). An RF filter section of the tuner of the indoor unit selects the one of the RF signals received from the block converter corresponding to the selected channel, and a mixer/local oscillator section of the tuner converts the selected RF signal to a lower, intermediate frequency (IF) range for filtering and demodulation.

In newer satellite television systems, such as the DirecTv™ operated by the Hughes Corporation of California, television information is transmitted in digital form. The RF signals are transmitted by the satellite in the Ku band, and are converted by the block converter to the L band. The frequency range of the RF signals transmitted by the satellite is somewhat smaller (e.g., between 12.2 and 12.7 GHz) than that for the analog satellite television system, and the frequency range of RF signals produced by the block converter is accordingly somewhat smaller (e.g., between 950 and 1450 MHz).

In a digital satellite television broadcast system, the television information is digitized, compressed and organized into a series or stream of data packets corresponding to respective video, audio, and data portions of the television information. The digital data is modulated on to a RF carrier signal in what is known as QPSK (Quaternary Phase Shift Keying) modulation and the RF signal is transmitted to a satellite in earth orbit, from which it is retransmitted back to the earth.

In QPSK modulation, the phases of two quadrature phase signals, I and Q, are controlled in response to the bits of respective digital data streams. For example, the phase is set to 0 degrees (°) in response to a low logic level ("0"), and the phase is set to 180° in response to a high logic level ("1"). The phase shift modulated I and Q signals are combined and the result transmitted as a QPSK modulated RF carrier signal. Accordingly, each symbol of the modulated QPSK carrier indicates one of four logic states, i.e., 00, 01, 10 and 11

The conversion stage of the block converter of the outdoor unit usually includes an RF local oscillator which is not stabilized against variations caused by temperature and aging. The result is that the frequency of the local oscillator signal of the block converter changes, causing a corresponding change or offset of the frequencies of the carrier signals of the RF signals received by the tuner of the indoor unit. As a consequence, the frequency of the near base-band signal produced by the tuner also changes or is offset from its nominal value. If the frequency of the near base-band signal deviates from its nominal value, the digital signals modulated on the near base-band signal cannot be properly demodulated and the information they represent cannot be properly reconstructed.

When the deviation is within a pull-in range of the digital carrier recovery loop (CTL) of the QPSK demodulator, the undesirable offset may properly be corrected by the phase lock loop operation of the CTL. If the frequency of the near base-band signal changes too far from its nominal value (i.e., outside the pull-in range of the CTL), the tuning system changes the frequency of the tuner local oscillator (LO) in order to bring the offset signal within the pull-in range of the CTL.

It is noted, however, that during the process for searching for the offset signal, the CTL may erroneously be locked at a point known as a "false lock point" where the phase error is sufficiently small such that the system appears to be locked but no real offset signal exists. As a result, the tuning system will spend a significant amount of time determining whether or not the CTL has properly acquired the real offset signal by checking other indicators. This undesirably slows down the entire operation of the tuning system.

SUMMARY

In order to solve the problems addressed above, the present invention concerns an offset frequency correction system, wherein searching for an offset signal starts from an end point of a band of frequencies in which the offset signal may be found.

This and other aspects of the invention will be described in detail with reference to the accompanying Drawings.

BRIEF DESCRIPTION OF THE DRAWINGS

In the Drawing.

In the various Figures, the same or similar reference designations are used to identify the same or similar elements.

DESCRIPTION OF THE PREFERRED EMBODIMENT

The invention will be described with reference to a digital satellite television system in which television information is transmitted in encoded and compressed form in accordance with a predetermined digital compression standard, such as MPEG. MPEG is an international standard for the coded representation of moving picture and associated audio information developed by the Motion Pictures Expert Group. The DirecTv™ satellite television transmission system operated by the Hughes Corporation of California is such a digital satellite television transmission system.

Figure 1:
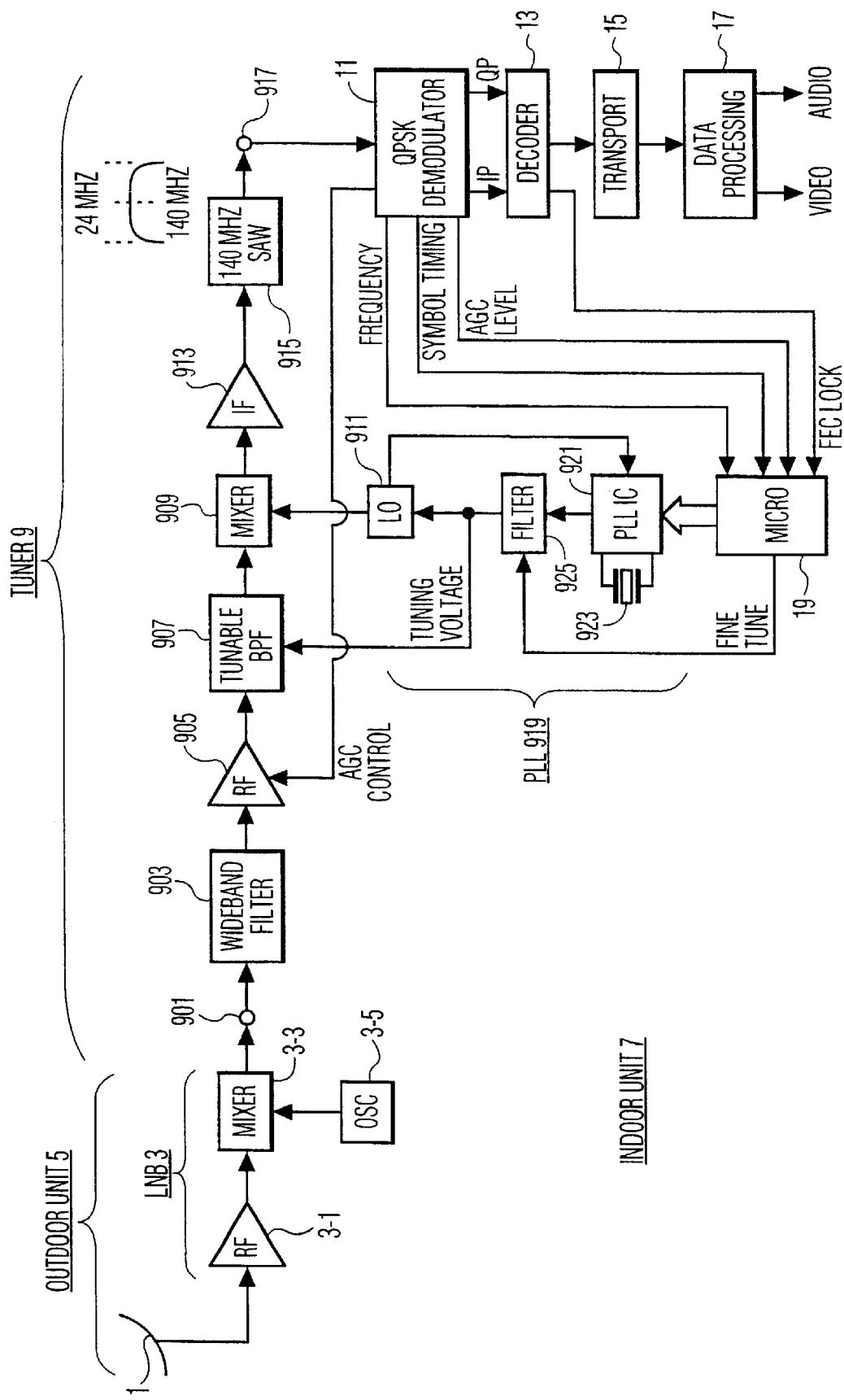
FIG. 1 is a block diagram of a digital satellite television receiver including a tuning system which may utilize the invention.

In the digital satellite television receiver shown in FIG. 1, RF signals modulated with digital signals representing video and audio information which have been transmitted by a satellite (not shown) are received by a dish-like antenna 1. The relatively high frequency received RF signals (e.g., in the Ku frequency range between 12.2 and 12.7 GHz) are converted by a block converter 3, including RF amplifier 3-1, mixer 3-3 and oscillator 3-5, to relatively lower frequency RF signals (e.g., in the L band between 950 and 1450 MHz). Amplifier 3-1 is a "low noise" amplifier and, therefore, block converter 3 is often referred to by the initials "LNB" for "low noise block converter". Antenna 1 and LNB 3 are included in a so-called "outdoor unit" 5 of the receiving system. The remaining portion of the receiver is included in a so-called "indoor unit" 7.

Indoor unit 7 includes tuner 9 for selecting the RF signal which contains the packets for the desired program from the plurality of RF signals received from outdoor unit 5 and for converting the selected RF signal to a corresponding lower, intermediate frequency (IF) signal.

The remaining portion of indoor unit 7 demodulates, decodes and decompresses the digital information carried in QPSK modulation form to produce streams of digital video and audio samples corresponding to the desired program, and, thereafter, converts the digital sample streams to respective analog video and audio signals suitable for reproduction or recording. More specifically, QPSK demodulation 11 demodulates the near base-band signal to produce two pulse signals IP and QP which contain respective streams of data bits corresponding to the data represented by the phase shift modulated I and Q signals generated in the transmitter. A decoder 13 organizes the bits of the IP and QP signals into data blocks, corrects transmission errors in the data blocks based on error codes which have been embedded in the transmitted data at the transmitter, and reproduces the transmitted MPEG video and audio packets. The video and audio packets are routed by a transport unit 15 to respective video and audio sections of a data processing unit 17 where they are decompressed and converted to respective analog signals. A microprocessor 19 controls the operation of various sections of indoor unit 7.

Tuner 9 receives the RF signal provided by LNB 3 at an input 901. The RF input signals are filtered by wideband filter 903, amplified by RF amplifier 905, and filtered by tunable bandpass filter 907. Tunable bandpass filter (BPF) 907 selects the desired RF signal and rejects unwanted RF signals. The resultant RF signal is coupled to a first input of mixer 909. A local oscillator signal produced by local oscillator (LO) 911 is coupled to a second input of mixer 909. The output of mixer 909 is amplified by amplifier 913 and coupled to the input of IF filter 915 comprising a SAW device. The output of IF filter 915 is coupled to output 917 of tuner 9.

The frequency of LO 911 is controlled by phase locked loop (PLL) arrangement 919 comprising PLL integrated circuit (IC) 921, external frequency reference crystal 923 and external filter network 925. The frequency of the LO signal is controlled by PLL 919 in accordance with instructions generated by microprocessor 19.

The carriers of the RF signals transmitted by the satellite and received by antenna 1 have very stable frequencies which remain at "nominal" values. Therefore, as long as the frequency of oscillator 3-5 of LNB 3 is stable and remains at its nominal value, the frequencies of carriers of the RF signals received by tuner 9 of indoor unit 7 will be at their nominal values. Unfortunately, the frequency of oscillator 3-5 can change with time and temperature. The frequency offset of the oscillator 3-5 with respect to its nominal frequency cause corresponding offsets of carrier frequencies of the RF signals received by tuner 9. To compensate for these frequency offsets, the frequency of LO 911 of tuner 9 is changed under the control of microprocessor 19 in response to frequency status information received from QPSK demodulation 11.

Figure 2:
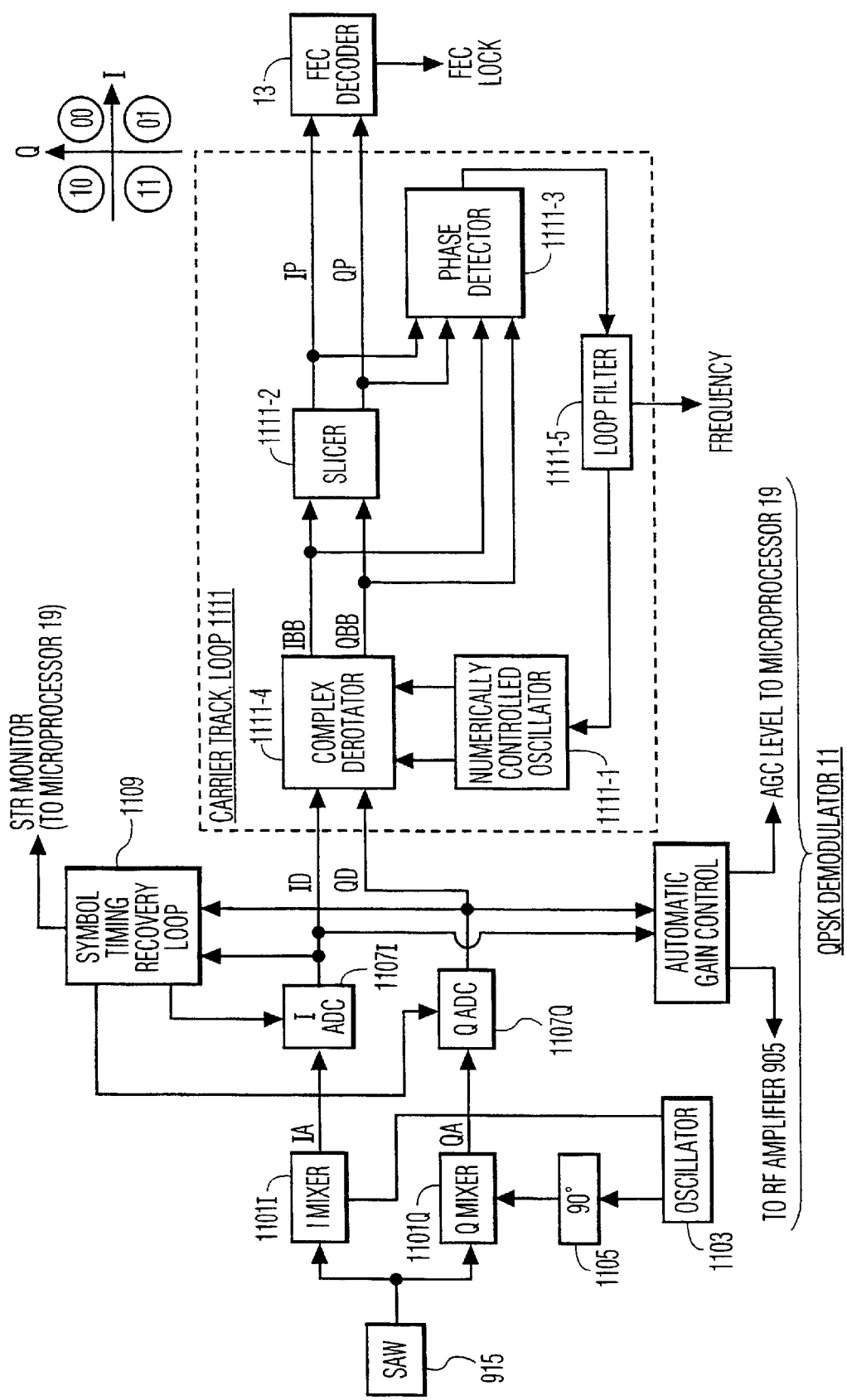
FIG. 2 is a block diagram of a digital demodulator for use in the satellite receiver shown in FIG. 1 and useful in understanding the recovery of digital data from the tuning system shown in FIG. 1.

As shown in FIG. 2, the IF signal produced by IF SAW filter 915 is coupled to respective first inputs of mixers 1101I and 1101Q. The letters "I" and "Q" signify "in-phase" and "quadrature". The output signal of relatively stable frequency oscillator 1103 is directly coupled to mixer 1101I and indirectly coupled to mixer 1101Q via 90 degree (90°) phase shift network 1105. Mixer 1101I produces an "in-phase", so-called "near" baseband (much lower frequency) version (IA) of the IF signal, while mixer 1101Q produces "quadrature", near baseband version (QA) of the IF signal, which is shifted 90 degrees with respect to the "in-phase" signal (IA). The letter "A" signifies "analog".

The IA and QA signals are coupled to respective analog-to-digital converters (ADCs) 1107I and 1107Q. Analog-to-digital converters 1107I and 1107Q also receive a clock signal from "symbol timing recovery loop" 1109 and produce respective series of digital samples ID and QD. The letter "D" signifies "digital". Symbol timing recovery (STR) loop 1109 includes a controlled oscillator (not shown) from which the clock signal for ADCs 1107I and 1107Q is derived. The controlled oscillator is controlled by a hybrid (part digital and part analog) phase locked loop (not shown) so that the digital samples are synchronized with the incoming symbol rate and phase. The analog signals can be viewed as a stream of pulses. The function of STR loop 1109 is to phase lock the clock so that the ADC samples the analog signal at the peaks of the pulses. In other words, STR loop 1109 synchronizes the sampling operation of ADCs 1107I and 1107Q with the arrival of each received symbol.

The ID and QD signals are also processed by a "carrier track loop" (CTL) 1111. CTL 1111 demodulates the digital sample signals ID and QD so as to form respective pulse signals IP and QP. The letter "P" signifies "pulse". Although the signals have been demodulated (broken down into IA and QA components), they were demodulated with a non-synchronous carrier. Since the demodulating carrier was not synchronized with the transmitted carrier, the constellation will still be rotating. It is typically called a Near Baseband Signal at this point. Once it has been derotated, it is referred to as a "Base-Band Signal". Thus the IBB and QBB nomenclature on the output of Derotator 1111-4. The baseband signals can be plotted on a I vs. Q plot which creates the "constellation" diagram. The baseband signal is input to slicer 111-2 which estimates which of the four constellation points was transmitted. Each of the IP and QP pulse signals contain a series of pulses corresponding to data bits. The data bits have either a logic low ("0") level or logic high ("1") level corresponding to 0° and 180° phase shifts, respectively, of the I and Q signals of the transmitted QPSK RF carrier. The IP and QP signal components are coupled to decoder 13, where the data bits are formatted into packets and forward error correction (FEC) performed.

CTL 1111 includes complex derotator 1111-4, slicer 1111-2, numerically controlled oscillator (NCO) 1111-1, phase detector 1111-3, and the loop filter 1111-5. Complex derotator 1111-4 is a complex multiplier that derotates the spinning constellation to output a stable constellation. The derotation is accomplished by multiplying the digital input ID and QD signals by the estimated sin and cosine of the estimated frequency offset and phase. The estimated frequency offset is the rate at which the near baseband signal is spinning. How this estimated offset is generated is described below.

Slicer 1111-2 takes the derotated constellation and outputs decisions based on the quadrant of the input. Each I, Q pair out of slicer 1111-2 is the estimate of which symbol was transmitted. Phase detector 1111-3 takes the input and output of slicer 1111-2 and generates a phase error signal for each symbol. This phase error signal is applied to loop filter 1111-5. Loop filter 111-5 controls numerically controlled oscillator (NCO) 1111-1 and provides an estimate of the offset frequency. This estimate is also available to microprocessor 19 as a control signal.

A frequency error, for example, due to a LNB derived frequency offset of the selected RF signal, causes a so-called "rotation" or "spinning" of the position of the two-bit demodulated data of the QPSK signal with time. The direction of rotation is dependent on whether the frequency offset is positive or negative. As is shown in FIG. 2, the data constellation for QPSK modulation has four points corresponding to the four possible logic combinations (00, 01, 10 and 11) of the respective two possible logic levels represented by the two possible phase shift values of the I and Q signals. Phase detector 1111-3 measures the position of the demodulated data relative to the ideal position in the data constellation. To correct for data rotation and tilt, the frequency, and thus the phase, of NCO 1111-1 is changed by loop filter 1111-5 in response to the output signal of phase detector 1111-3 until the rotation stops and the tilt is eliminated.

With this rotation stopped, the constellation is stabilized and CTL 1111 is considered "locked." Under this steady state condition, loop filter 1111-5 has correctly estimated the frequency and phase shifts that are needed to derotate the data so that the constellation is successfully stabilized. Loop filter 1111-5 has proportional and integral paths which are summed together to form the control for NCO 1111-1. The value of the integral path (which integrates the phase error) represents the frequency offset which cause the "rotation". This value is available to microprocessor 19 as a control signal, shown as the FREQUENCY signal in FIGS. 1 and 2. Microprocessor 19 compares successive samples of the FREQUENCY signal to determine if the constellation has been stabilized. If the difference in successive samples is small, the demodulation is recognized as "LOCKED". Under this steady state condition, the demodulated data IP and QP is reliable and passed on to FEC decoder 13. During the acquisition of a channel, if the current frequency of LO 911 does not allow a successful lock of CTL 1111, then the microprocessor 19 will adjust the frequency of LO 911 until either a LOCKED condition is found or a suitable frequency range has been covered.

Within limits, CTL 1111 can demodulate the QPSK data even when the frequency of the IF signal, and therefore the frequency of the IA and QA signals, is incorrect or offset. However, if the frequency offset is too great, a portion of the frequency spectrum of the IF signal will fall outside of the passband of SAW filter 915 due to the shift of the IF signal relative to the center frequency of SAW filter 915. This will cause a degradation of the signal to noise ratio of the receiver. Accordingly, as noted above, microprocessor 19 monitors a FREQUENCY signal generated by CTL 1111 to indicate the frequency offset of the IF signal. As the frequency offset caused by the LNB drift changes, CTL 1111 tracks the changes and FREQUENCY signal monitored by microprocessor 19 is updated. Upon the next channel acquisition, microprocessor 19 will use the last recorded frequency offset to provide a more accurate placement of LO 911. This should allow the signal to be quickly acquired without having to search by moving LO 911 again. If the frequency offset becomes so large as to cause degradation in the reliability of the demodulated data, eventually, FEC decoder 13 will be unable to correct the errors and break lock. Microprocessor 19 will request a reacquisition of the same channel and the last frequency offset will again be used to accurately place LO 911 for a reacquisition.

As noted above, the derotated data streams, IP and QP are processed by FEC decoder 13 shown in FIG. 1. The function of FEC decoder 13 is to correct errors incurred in the transmission of the data. For the decoder to be able to correct errors, the demodulated signal must be stabilized. Additionally, in order to correct the data, FEC decoder 13 must be set for the same code rate as the transmission code rate and synchronized to the packet boundaries. The FEC LOCK signal generated by FEC decoder 13 and monitored by microprocessor 19 indicates if all the above conditions are met and FEC decoder 13 is successfully passing error free data. For example, the FEC LOCK signal has a low logic level when FEC decoder 13 cannot correct the data, and the FEC LOCK signal has a high logic level when FEC decoder 13 can correct the data.

The FEC LOCK signal is used as the final determination of whether tuner 9, QPSK demodulation 11, and FEC decoder 13 are successfully locked because CTL 1111 can falsely stabilize on a "false lock point". At a "false lock point", the constellation does not appear to be spinning. But the constellation is actually rotating 90 degrees (or a multiple of 90 degrees) per symbol. Since there is another constellation point 90 degrees away, it appears to be stable. The "false lock points" occur at multiples of the symbol rate divided by eight. When CTL 1111 is stabilized at a false lock point, the FEC decoder will not be able to decode the data. Thus, the FEC LOCK signal will remain in a low logic level (unlocked).

In summary, whenever CTL 1111 encounters a false lock point, time will be wasted (1) for CTL 1111 to pull in the false lock point and (2) for the system to check the FEC LOCK signal to determine the validity of the lock point. This slows down the searching process of the entire tuning system.

The present invention deals specifically with how the slowing down of the search process is handled. Part of the invention resides in the recognition that the searching process is accelerated when the searching starts at an end point of a band of frequencies in which the offset signal may be found. This is (1) because the undesirable lock of CTL 1111 does not appear to occur at a false lock point and (2) because the operation of CTL 1111 is affected by arithmetic bias. This arithmetic bias is believed to result from the arithmetic computation employed in digital signal processing which may involve, for example, two's complement arithmetic and truncation with associated rounding errors..

In a conventional digital tuning system, the search for the offset signal starts approximately at the middle point of a band of frequencies in which the offset signal may be found. In one system, the search may start from the middle point and proceed in a positive direction while in another system, it may start searching in the opposite direction (i.e. in a negative direction). In either system, when no lock point is found (i.e., no offset signal in found) in one direction, the search continues again from the middle point and proceeds in the opposite direction.

In contrast, a system in accordance with aspects of the present invention starts searching at an end point of a band of frequencies in which the offset signal may be found. For example, if the search starts at the top most frequency of the band, the starting point of the CTL search is always above the frequency of the offset signal. Therefore, the system always tries to pull in a negative frequency offset.

In a typical embodiment, the arithmetic computation approach employed in the digital demodulation system appears to accelerate the entire process of pulling in negative frequency offsets because computation (such as two's complement arithmetic) may produce an arithmetic bias that biases the operation of CTL 1111 in favor of the search for the negative offset signal. Moreover, the arithmetic bias may aid in preventing CTL 1111 from being erroneously stabilized at a false lock point. That is, the arithmetic bias appears to contribute to destabilizing CTL 1111 at a false lock point. As a result, the tuning system does not waste time, at a false lock point, on determining whether or not it has acquired the real offset signal. Therefore, the entire search process will be accelerated.

Figure 3:
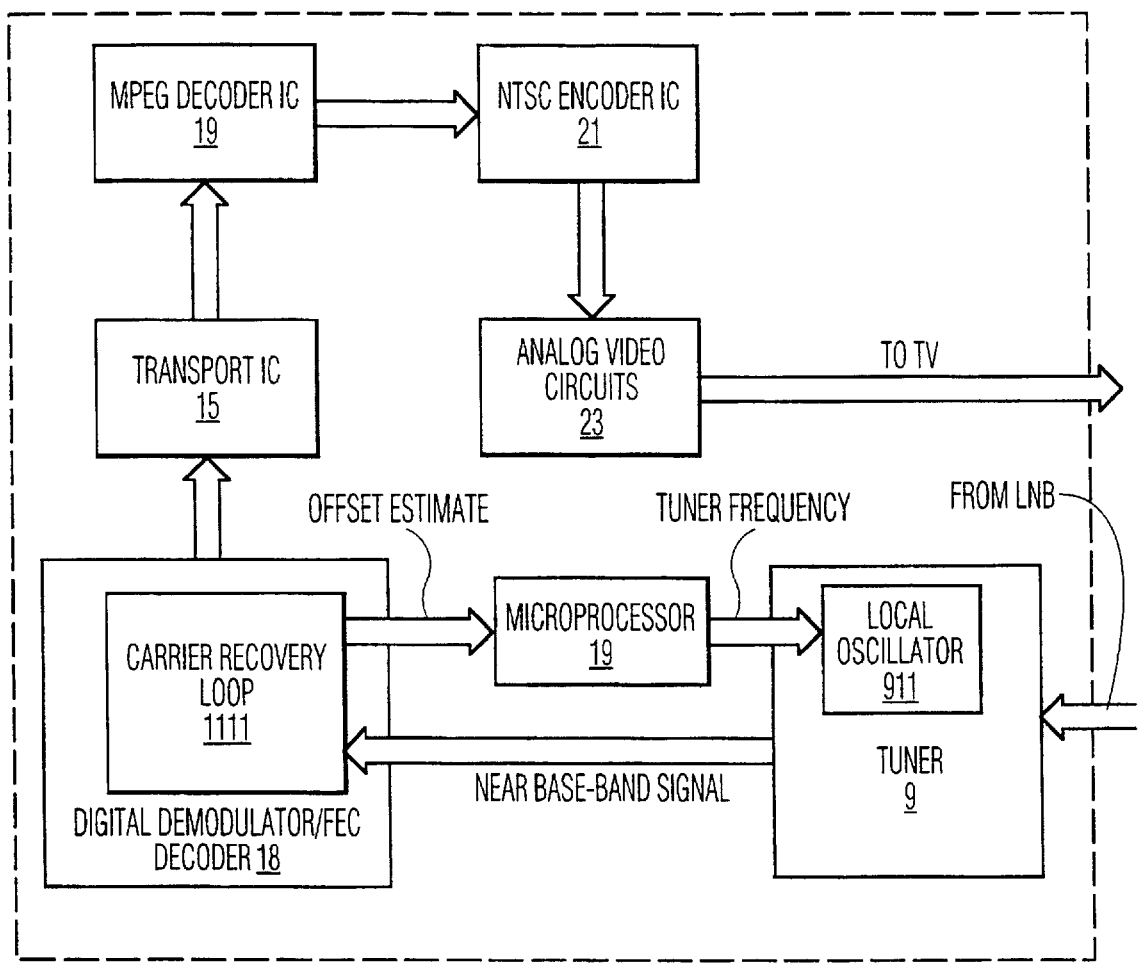
FIG. 3 is a simplified block diagram of a digital satellite television receiver shown in FIG. 1 and useful in understanding the operation of the tuning system.

FIG. 3 shows an exemplary tuning system suitable for implementing the described system. As shown in FIG. 3, tuner 9 receives the RF input signal and provides a signal that is near base-band to digital demodulator 18. Digital demodulator 18 generates a control signal which represents an estimate of the offset ΔF and provides the estimate to microprocessor 19. Microprocessor 19 generates a tuning voltage for LO 911 to cause retuning to the actual signal central frequency (Fc) using an estimate equal to Fi+ΔF.

Figure 4:
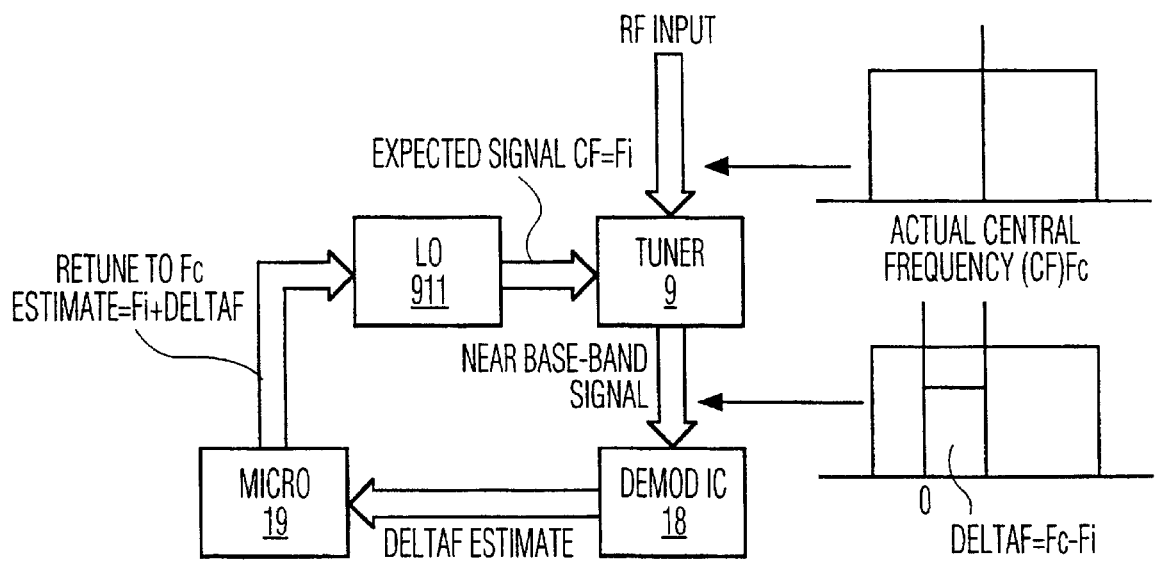
FIG. 4 is a picture representation of the operation of the tuning system shown in FIG. 1.

FIG. 4 illustrates the operation of the tuning system. Here microprocessor 19, LO 911, tuner 9, and demodulation integrated circuit which includes digital demodulator 18 are coupled in a loop as shown. An illustration in the upper right of FIG. 4 shows the frequency spectrum of the input signal having a central frequency (CF) at frequency Fc. The frequency spectrum of the output of the tuner is illustrated below the drawing of the input frequency spectrum and shows that the tuner output has an offset ΔF that is equal to Fc−Fi.

Figure 5:
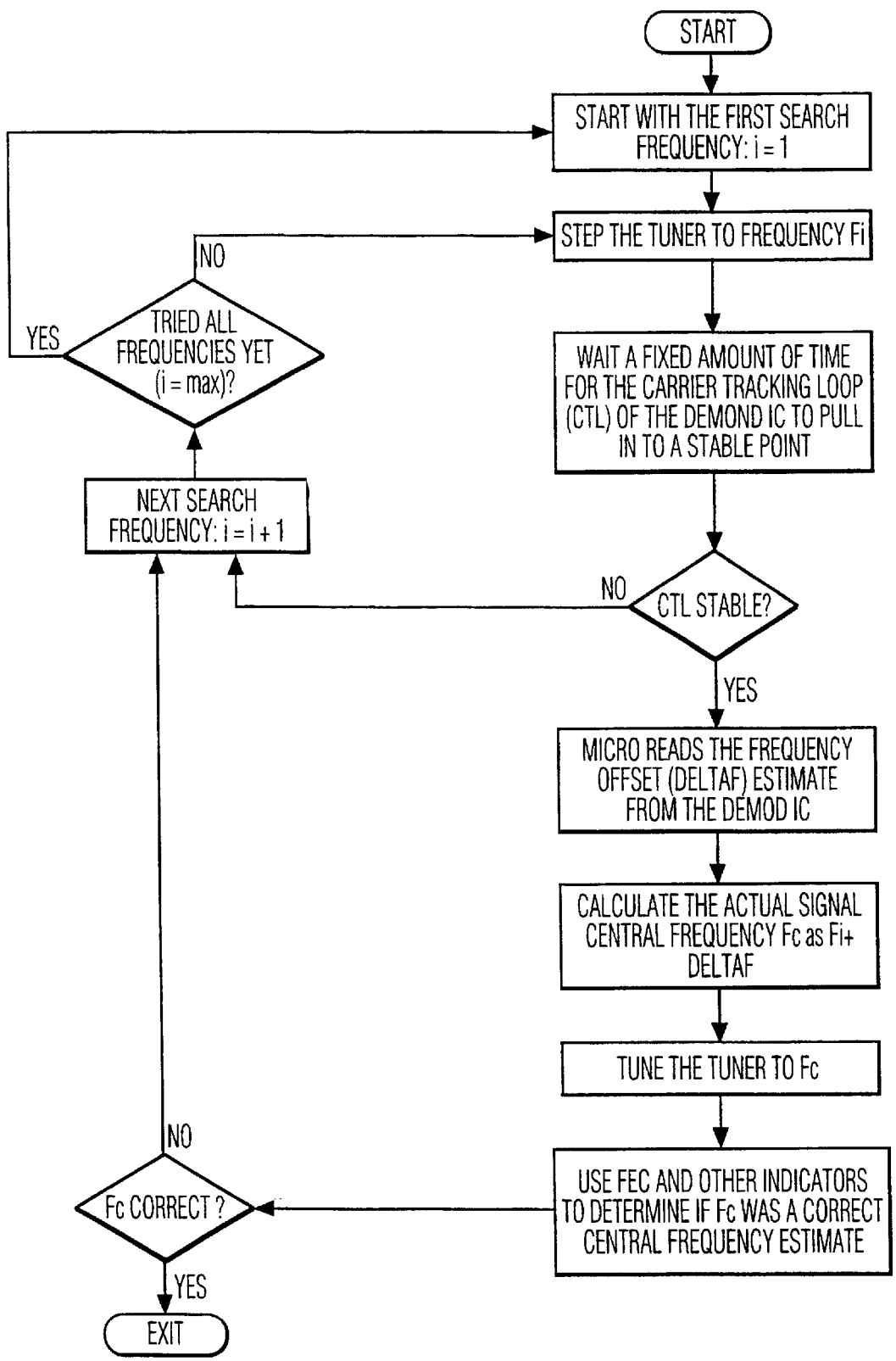
FIG. 5 is a flow chart of the tuning routine for searching an offset signal by the tuning system shown in FIG. 3 in accordance with an aspect of the present invention.

FIG. 5 shows a flow chart illustrating the operation of the system shown in FIG. 3. As seen in FIG. 5, the search is conducted stepwise. That is, tuner 9 is moved to predetermined frequencies (steps) within the allowed LNB drift area (e.g., +/−5 MHz). One value of index "i" is associated with each step in frequency Fi. At each step, CTL 1111 is allowed a certain amount of time to pull in towards a stable lock point. CTL 1111 is read and tuner 9 is positioned to correct for whatever offset CTL 1111 had to pull in. Further checking of the Forward Error Correction (FEC) output determines whether the LNB drift estimate is accepted as being accurate or whether searching is continued.

While the present invention has been described in terms of a specific embodiment, it will be appreciated that modifications may be made which will fall with in the scope of the invention. For example, other embodiments are envisioned such as one in which it may be advantageous to begin searching from the lowest frequency in the frequency band and to increase frequencies at each step. For example, various forms of arithmetic computation may be implemented in digital signal processing, one of which is two's complement as described above. These other forms of arithmetic computations may produce an arithmetic bias of a form different from that described above and, therefore, may make it desirable to search from the lowest frequency rather than from the highest frequency in a band.

What is claimed is:

1. A digital signal tuning system comprising:
    a tuner including a local oscillator for tuning an RF signal which bears digital information;
    a digital demodulator having a carrier recovery loop for demodulating said RF signal received by said tuner;
    said carrier recovery loop generating a control signal which represents a frequency offset between the frequency of said RF signal and a nominal RF frequency;
    means for varying the frequency of said local oscillator in response to said control signal; and
    said means for varying said frequency of said local oscillator starting from an end point of a given range of frequencies.

2. The digital signal tuning system of claim 1, wherein:
    said carrier recovery loop includes a numerical phase lock loop processing which is biased due to arithmetic processing and said end corresponds to said bias of said arithmetic process.

3. The digital signal tuning system of claim 2, wherein:
    said bias is negative due to two's complement arithmetic processing.

* * * * *